United States Patent
Long et al.

(10) Patent No.: US 6,306,710 B1
(45) Date of Patent: Oct. 23, 2001

(54) FABRICATION OF A GATE STRUCTURES HAVING A LONGER LENGTH TOWARD THE TOP FOR FORMATION OF A RECTANGULAR SHAPED SPACER

(75) Inventors: Wei Long, Sunnyvale; Olov Karlsson, San Jose; Bill Liu, San Jose; Scott Bell, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/498,231

(22) Filed: Feb. 3, 2000

(51) Int. Cl.[7] .................... H01L 21/336; H01L 21/3205; H01L 21/4763
(52) U.S. Cl. .................... 438/279; 438/302; 438/595
(58) Field of Search .................... 438/261, 182, 438/279, 303, 305, 622, 595

(56) References Cited

U.S. PATENT DOCUMENTS

| | | | |
|---|---|---|---|
| 5,225,360 | * 7/1993 | Shim et al. | 437/41 |
| 5,491,100 | * 2/1996 | Lee et al. | 437/41 |
| 5,545,578 | * 8/1996 | Park et al. | 437/44 |
| 5,834,817 | * 11/1998 | Satoh et al. | 257/387 |
| 5,897,353 | * 4/1999 | Kim et al. | 438/261 |
| 5,981,148 | * 11/1999 | Brown et al. | 430/314 |
| 5,994,192 | * 11/1999 | Chen | 438/303 |
| 6,037,228 | * 3/2000 | Hsu | 438/279 |
| 6,040,241 | * 3/2000 | Lee et al. | 438/622 |
| 6,143,611 | * 11/2000 | Gilton et al. | 438/279 |
| 6,238,972 | * 5/2001 | Yew et al. | 438/255 |

* cited by examiner

Primary Examiner—John F. Niebling
Assistant Examiner—Walter L. Lindsay, Jr.
(74) Attorney, Agent, or Firm—Monica H. Choi

(57) ABSTRACT

The gate structure of the MOSFET of the present invention is formed to have a longer length toward the top of the gate structure such that a spacer having a substantially rectangular shaped is formed at the sidewalls of the gate structure. For fabricating a gate structure of a field effect transistor on a semiconductor substrate, a layer of gate structure material is deposited on the semiconductor substrate. The composition of the layer of gate structure material is adjusted along a depth of the layer of gate structure material for a slower etch rate toward a top of the layer of gate structure material that is further from the semiconductor substrate. The gate structure is then formed by patterning and etching the layer of gate structure material. The slower etch rate toward the top of the layer of gate structure material results in a longer length toward a top of the gate structure that is further from the semiconductor substrate. Spacer dielectric is deposited conformally on exposed surfaces of the gate structure. The spacer dielectric is anisotropically etched such that the spacer dielectric remains on sidewalls of the gate structure. The longer length toward the top of the gate structure results in a substantially rectangular shaped spacer dielectric remaining on the sidewalls of the gate structure. The present invention may be used to particular advantage when the gate structure and the spacer having the rectangular shape are formed as part of a field effect transistor such as a MOSFET.

13 Claims, 6 Drawing Sheets

FABRICATION OF A GATE STRUCTURES HAVING A LONGER LENGTH TOWARD THE TOP FOR FORMATION OF A RECTANGULAR SHAPED SPACER

TECHNICAL FIELD

The present invention relates generally to fabrication of integrated circuits, and more particularly, to a method for fabricating a rectangular shaped spacer around a gate structure of a field effect transistor by forming a longer length toward the top of the gate structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Figure 1:
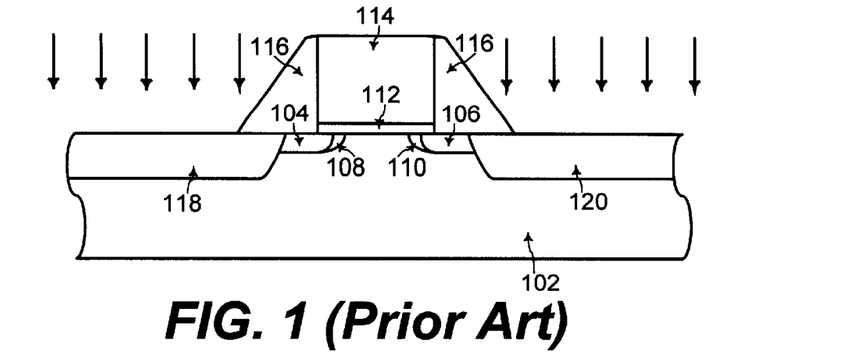
FIG. 1 shows a cross-sectional view of a MOSFET (Metal Oxide Semiconductor Field Effect Transistor) having a spacer with a substantially triangular shape according to the prior art.

Referring to FIG. 1, a common component of a monolithic IC is a MOSFET (Metal Oxide Semiconductor Field Effect Transistor) which is fabricated within a semiconductor substrate 102 which may be a silicon substrate. FIG. 1 illustrates the cross-sectional view of the MOSFET as known to one of ordinary skill in the art of integrated circuits. The scaled down MOSFET having submicron or nanometer dimensions includes a drain extension 104 and a source extension 106 formed within the semiconductor substrate 102. The drain extension 104 and the source extension 106 are shallow doped junctions to minimize shortchannel effects in the MOSFET having submicron or nanometer dimensions, as known to one of ordinary skill in the art of integrated circuit fabrication.

To further minimize short-channel effects in the MOSFET, a drain pocket 108 surrounds the drain extension 104 near the channel of the MOSFET, and a source pocket 110 surrounds the source extension 106 near the channel of the MOSFET, as known to one of ordinary skill in the art of integrated circuit fabrication. The drain extension 104 and the source extension 106 include an N-type dopant when the MOSFET is an NMOSFET (N-channel Metal Oxide Semiconductor Field Effect Transistor). Alternatively, the drain extension 104 and the source extension 106 include a P-type dopant when the MOSFET is a PMOSFET (P-channel Metal Oxide Semiconductor Field Effect Transistor). For minimizing short-channel effects within the MOSFET, the drain pocket 108 and the source pocket 110 are doped with a P-type dopant for an NMOSFET. Alternatively, the drain pocket 108 and the source pocket 110 are doped with an N-type dopant for a PMOSFET.

The MOSFET of FIG. 1 further includes a gate dielectric 112 which may be comprised of silicon dioxide for the silicon substrate 102 and includes a gate structure 114 which may be a polysilicon gate. The MOSFET also includes a spacer 116 disposed on the sidewalls of the gate structure 114 and the gate dielectric 112. The spacer 116 is comprised of a dielectric such as silicon dioxide for example.

The MOSFET of FIG. 1 further includes a drain contact junction 118 such that a drain silicide may be formed therein for providing contact to the drain of the MOSFET and includes a source contact junction 120 such that a source silicide may be formed therein for providing contact to the source of the MOSFET. The drain contact junction 118 and the source contact junction 120 are fabricated as deeper junctions such that a relatively large size of the drain silicide and the source silicide respectively may be fabricated therein to provide low resistance contact to the drain and the source respectively of the MOSFET.

Referring to the cross-sectional view of the MOSFET of FIG. 1 of the prior art, the gate structure 114 has a substantially rectangular shape, and the spacer 116 has a substantially triangular shape. During implantation of dopant for formation of the drain contact junction 118 and the source contact junction 120, because the triangular shape of the spacer 116 results in a gradual diminishing of the thickness at the edges of the spacer 116 away from the gate structure 114, the implantation energy used for implanting the dopant for the drain contact junction 118 and the source contact junction 120 is limited. Such a limitation in the implantation energy leads to limitation in the depth of the drain contact junction 118 and the source contact junction 120. However, a large depth of the drain contact junction 118 and the source contact junction 120 is desired such that a large volume of silicide may be formed therein for providing low resistance contact to the drain and source of the MOSFET.

In addition, with such a limitation in the implantation energy, the drain contact junction 118 and the source contact junction 120 are not as abrupt and extend further under the dielectric spacer 116 resulting in undesired capacitance at the drain and source of the MOSFET which degrades the speed performance of the MOSFET. Furthermore, a high implantation energy would result in a deeper junction with a more gradual change in concentration of the implanted dopant. Such a gradual change in concentration of the implanted dopant would result in lower junction capacitance for the drain contact junction 118 and the source contact junction 120 for enhanced speed performance of the MOSFET.

Figure 2:
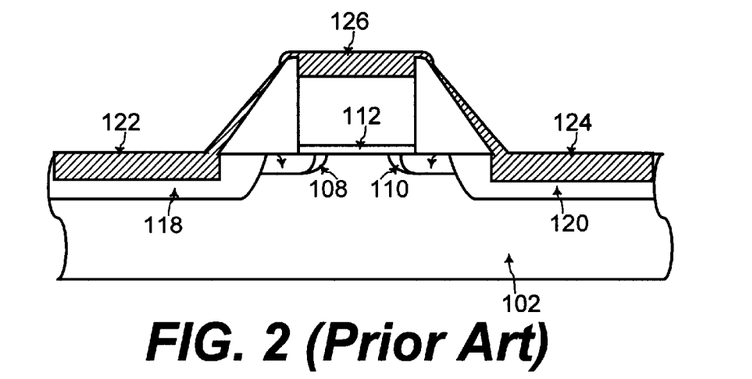
FIG. 2 shows the cross-sectional view of the MOSFET of FIG. 1 with formation of drain silicide and source silicide that undesirably bridge with a gate silicide because of the substantially triangular shape of the spacer of the prior art.

Referring to FIG. 2, a drain silicide 122 is formed with the drain contact junction 118 for providing contact to the drain of the MOSFET, and a source silicide 124 is formed with the source contact junction 120 for providing contact to the source of the MOSFET. In addition, a gate silicide 126 is formed on the gate structure 114 for providing contact to the gate of the MOSFET. (Elements having the same reference number in FIGS. 1 and 2 refer to elements having similar structure and function.) In the MOSFET of FIG. 2 of the prior art, because the spacer 116 is triangular in shape, the gate silicide 126 may contact the drain silicide 122 and the source silicide 124 according to the "bridging effect" as illustrated in FIG. 2 to undesirably couple the gate, the drain, and the source of the MOSFET, as known to one of ordinary skill in the art of integrated circuit fabrication.

Because of these enumerated disadvantages of the triangular shaped spacer 116 of the prior art, a method for fabrication of a spacer having substantially a rectangular shape is desired. With a substantially rectangular shaped spacer, the implantation energy may be higher for implanting the dopant for formation of the drain contact junction 118 and the source contact junction 120. With such a higher implantation energy, the drain contact junction 118 and the source contact junction 120 may be formed with deeper depth such that a larger volume of drain silicide and source silicide may be formed therein to provide low resistance contact to the drain and the source of the MOSFET.

In addition, with a rectangular spacer of the present invention, the drain contact junction 118 and the source contact junction 120 at the side toward the channel of the MOSFET are more abrupt junctions that extend less under the dielectric spacer 116 resulting in lower capacitance at the drain and source of the MOSFET to enhance the speed performance of the MOSFET. Furthermore, a high implantation energy results in deeper junctions with a more gradual change in concentration of the implanted dopant. Such a gradual change in concentration of the implanted dopant would result in lower junction capacitance for the drain contact junction 118 and the source contact junction 120 for enhanced speed performance of the MOSFET.

SUMMARY OF THE INVENTION

Accordingly, in a general aspect of the present invention, the gate structure of the MOSFET of the present invention is formed to have a longer length toward the top of the gate structure such that a spacer having a substantially rectangular shape is formed at the sidewalls of the gate structure.

In one embodiment of the present invention, a method for fabricating a gate structure of a field effect transistor on a semiconductor substrate includes the step of depositing a layer of gate structure material on the semiconductor substrate. The composition of the layer of gate structure material is adjusted along a depth of the layer of gate structure material for a slower etch rate toward a top of the layer of gate structure material that is further from the semiconductor substrate. The gate structure is then formed by patterning and etching the layer of gate structure material. The slower etch rate toward the top of the layer of gate structure material results in a longer length toward a top of the gate structure that is further from the semiconductor substrate.

In one aspect of the present invention, the composition of the layer of gate structure material is adjusted along the depth of the layer of gate structure material by implanting a dopant into the layer of gate structure material. The concentration of the dopant varies along the depth of the layer of gate structure material, and a lower concentration of the dopant toward the top of the layer of gate structure material results in the slower etch rate toward the top of the layer of gate structure material.

In another aspect of the present invention, the composition of the layer of gate structure material is adjusted along the depth of the layer of gate structure material by depositing multiple layers of gate structure material. For example, a bottom layer of amorphous silicon is deposited closer to the semiconductor substrate as part of the layer of gate structure material, and a top layer of polysilicon is deposited further from the semiconductor substrate as part of the layer of gate structure material. The top layer of polysilicon etches with the slower etch rate than the bottom layer of amorphous silicon.

According to a further aspect of the present invention, spacer dielectric is deposited conformally on exposed surfaces of the gate structure. The spacer dielectric is anisotropically etched such that the spacer dielectric remains on sidewalls of the gate structure. The longer length toward the top of the gate structure results in a substantially rectangular shaped spacer dielectric remaining on the sidewalls of the gate structure.

The present invention may be used to particular advantage when the gate structure and the spacer having the rectangular shape are formed as part of a field effect transistor such as a MOSFET. With a substantially rectangular shaped spacer, the implantation energy may be higher for implanting the dopant for formation of the drain contact junction and the source contact junction. With such a higher implantation energy, the drain contact junction and the source contact junction may be formed with deeper depth such that a larger volume of drain silicide and source silicide may be formed therein to provide low resistance contact to the drain and the source of the MOSFET.

In addition, with the rectangular spacer of the present invention, the drain contact junction and the source contact junction at the side towards the channel of the MOSFET are more abrupt junctions that extend less under the dielectric spacer resulting in lower capacitance at the drain and source of the MOSFET to enhance the speed performance of the MOSFET. Furthermore, a high implantation energy results in deeper junctions with a more gradual change in concentration of the implanted dopant. Such a gradual change in concentration of the implanted dopant would result in lower junction capacitance for the drain contact junction and the source contact junction for enhanced speed performance of the MOSFET.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

Figure 3:
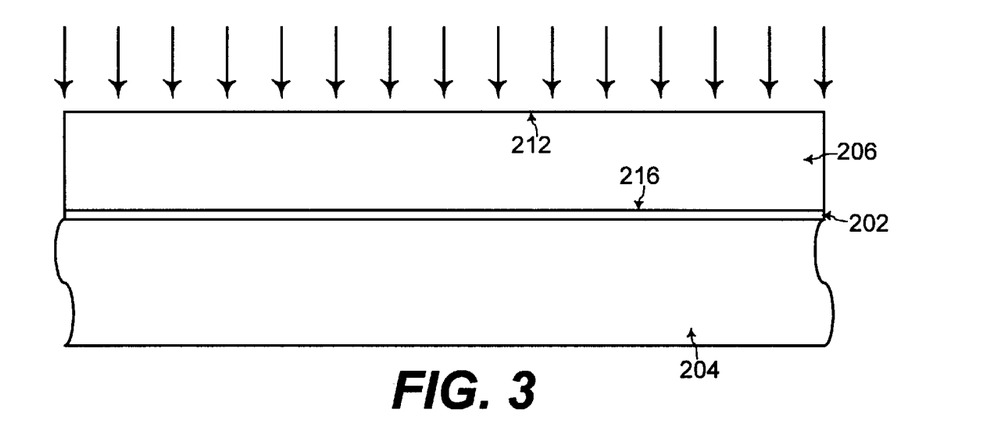
FIGS. 3, 4, 5, 6, 7, 8, 9, 10, 11, 12, 13, 14, 15, 16, and 17 illustrate process steps for fabricating a spacer having substantially a rectangular shape by forming a gate structure with a longer length toward the top of the gate structure for a MOSFET, according to an aspect of the present invention.

A spacer having a substantially rectangular shape is formed on the sidewalls of a gate structure of a MOSFET (Metal Oxide Semiconductor Field Effect Transistor) according to an aspect of the present invention. Referring to FIG. 3, for formation of the MOSFET, a layer of gate dielectric 202 is deposited on a semiconductor substrate 204, and a layer of gate structure material 206 is deposited on the layer of gate dielectric 202. The semiconductor substrate 204 may be a silicon substrate for example. In that case, the gate dielectric 202 may be comprised of silicon dioxide ($SiO_2$), and the layer of gate structure material 206 may be comprised of polysilicon. Processes for deposition of such gate dielectric 202 and such layer of gate structure material 206 are known to one of ordinary skill in the art of integrated circuit fabrication.

The layer of gate structure material 206 is patterned and etched to form a gate structure. For forming a spacer having a substantially rectangular shape on the sidewalls of the gate structure, the gate structure is formed to have a longer length toward the top of the gate structure away from the semiconductor substrate 204. Thus, the length of the gate structure is controlled along the depth of the gate structure from the top of the gate structure furthest away from the semiconductor substrate 204 to the bottom of the gate structure closest to the semiconductor substrate 204.

According to an aspect of the present invention, the length of the gate structure is controlled along the depth of the gate structure by adjusting the composition of the layer of gate structure material 206 along the depth of the layer of gate structure material 206 to adjust the etch rate of the layer of gate structure material 206 along the depth of the layer of gate structure material 206. For example, referring to FIG. 3, a dopant is implanted into the layer of gate structure material 206 with the concentration of the dopant varying along the depth of the layer of gate structure material 206.

Figure 4:
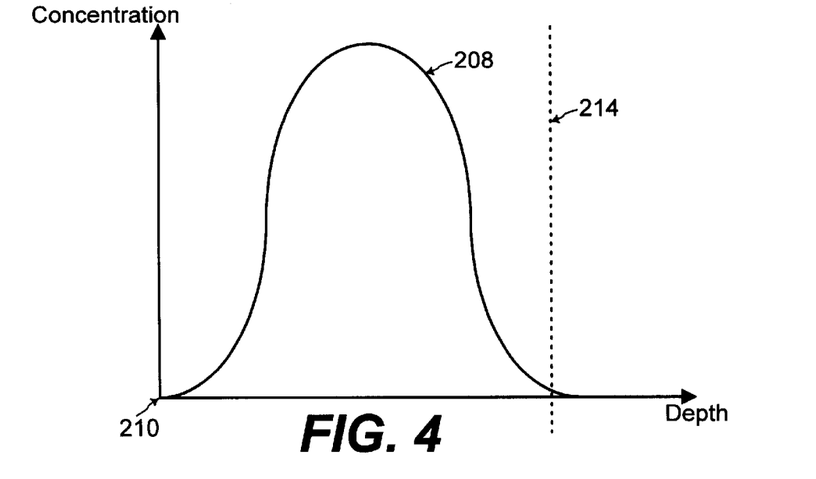

Referring to FIG. 4, a concentration profile 208 is a graph of the concentration of the implanted dopant along the depth of the layer of gate structure material 206. Referring to FIGS. 3 and 4, an origin 210 of the concentration profile 208 represents the concentration of the implanted dopant at the top 212 of the layer of gate structure material 206 furthest from the semiconductor substrate 204. The dashed line 214 of the concentration profile 208 of FIG. 4 represents the concentration of the implanted dopant at the bottom 216 of the layer of gate structure material 206 closest to the semiconductor substrate 204. Processes for dopant implantation with the Gaussian shaped concentration profile 208 of FIG. 4 are known to one of ordinary skill in the art of integrated circuit fabrication.

The dopant implanted into the layer of gate structure material 206 according to the concentration profile 208 of FIG. 4 affects the etch rate of the gate structure material 206. For example, when such a dopant is nitrogen or silicon, a higher concentration of such dopant within a portion of the layer of gate structure material 206 increases the etch rate of that portion of the layer of gate structure material 206.

Figure 5:
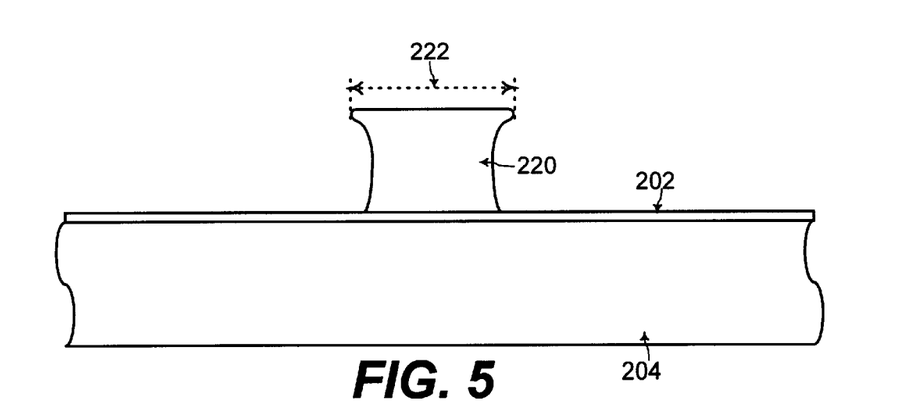

Referring to FIGS. 3, 4, and 5, with the concentration profile 208 of FIG. 4, the concentration of the dopant is higher at the middle of the layer of gate structure material 206 and is lower toward the top 212 and the bottom 216 of the layer of gate structure material 206. With such a concentration profile 208 of FIG. 4, the layer of gate structure material 206 etches faster at the middle of the layer of gate structure material 206 and etches slower toward the top 212 and the bottom 216 of the layer of gate structure material 206.

Referring to FIG. 5, a gate structure 220 is formed by patterning and etching the layer of gate structure material 206 that has the dopant concentration profile 208 of FIG. 4. Because the layer of gate structure material 206 etches faster at the middle of the layer of gate structure material 206 and etches slower toward the top 212 and the bottom 216 of the layer of gate structure material 206, the gate structure 220 has a longer length 222 toward the top 212 and the bottom 216 than at the middle of the layer of gate structure material 206. Thus, the gate structure 220 of FIG. 5 is substantially I-shaped.

Figure 6:
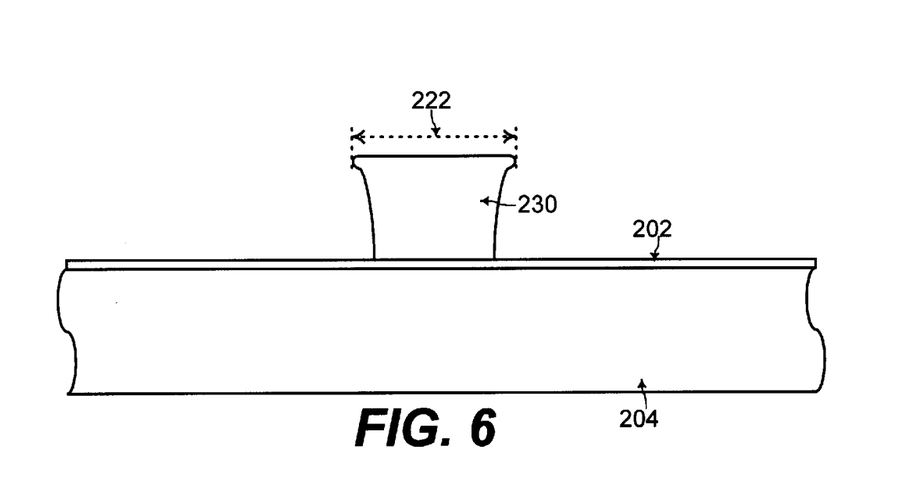
Figure 7:
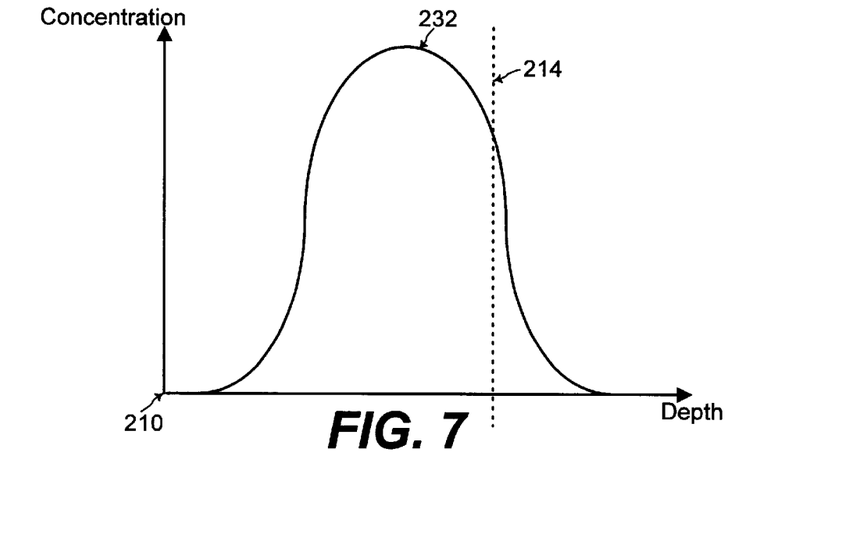

In another embodiment of the present invention, referring to FIGS. 3, 6, and 7, the implantation energy of the dopant implanted into the layer of gate structure material 206 may be adjusted to form a gate structure 230 of FIG. 6 that is substantially T-shaped. In that case, referring to FIG. 7, the implantation energy is increased such that a concentration profile 232 results in higher concentration of the dopant deeper down to the bottom 216 of the layer of gate structure material 206 (as indicated at the dashed line 214 in FIG. 7).

Referring to FIGS. 3, 6, and 7, with the concentration profile 232 of FIG. 7, the concentration of the dopant is higher toward the bottom 216 of the layer of gate structure material 206 and is lower toward the top 212 of the layer of gate structure material 206. With such a concentration profile 232 of FIG. 7, the layer of gate structure material 206 etches faster toward the bottom of the layer of gate structure material 206 and etches slower toward the top 212 of the layer of gate structure material 206. Thus, the gate structure 230 of FIG. 6 has a longer length 222 toward the top 212 of the layer of gate structure 230 such that the gate structure 230 is substantially T-shaped.

The longer length toward the top 212 of the gate structure 220 or 230 enhances the rectangular shape of the spacer to be formed at the sidewalls of the gate structure 220 or 230, as will be further described herein. However, before formation of the spacer on the sidewalls of the gate structure 220 or 230 of the MOSFET, drain and source extensions are formed around the gate structure 220 or 230 of the MOSFET. Further process steps for fabrication of the components of a MOSFET are described with the substantially T-shaped gate structure 230 of FIG. 6. However, similar process steps may be used for fabrication of the MOSFET with the I-shaped gate structure 220 of FIG. 5 as would be apparent to one of ordinary skill in the art of integrated circuit fabrication from the description herein.

Figure 8:
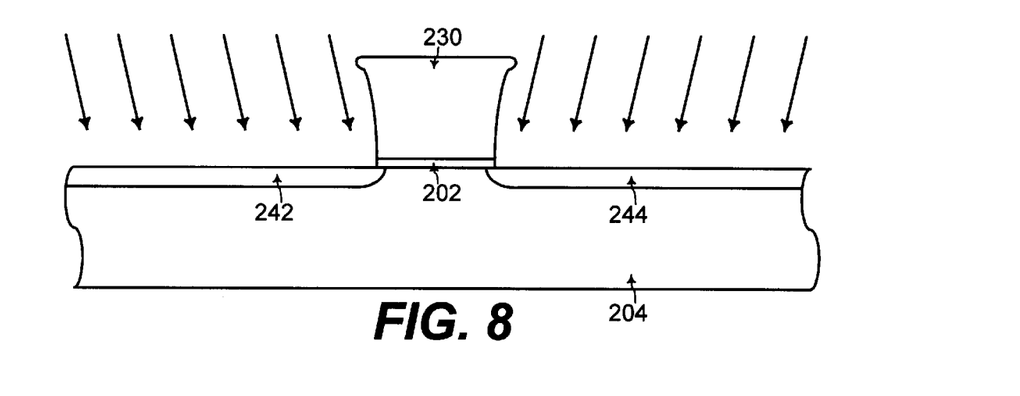
Figure 9:
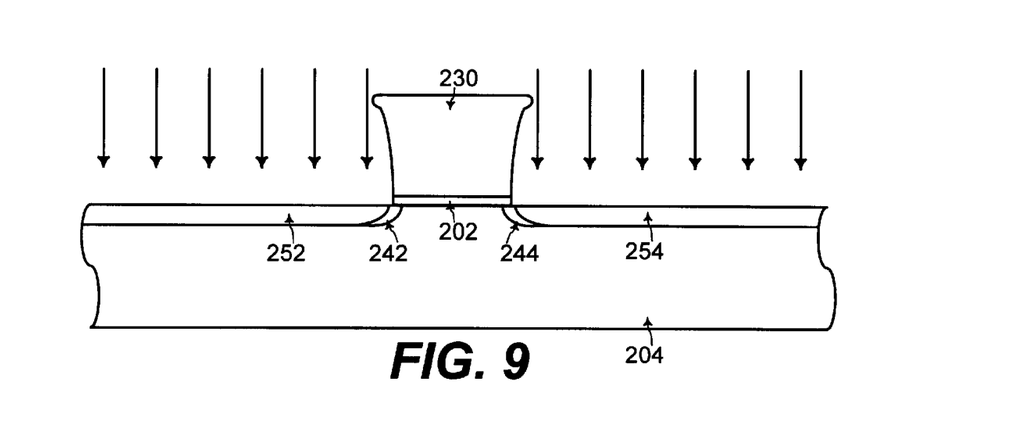

Referring to FIGS. 6 and 8, exposed regions of the gate dielectric 202 are etched such that the gate dielectric 202 remains under the gate structure 230 as illustrated in FIG. 8. Referring to FIG. 8, a halo dopant is implanted toward the semiconductor substrate 204 to form a drain pocket 242 and a source pocket 244 of the MOSFET around the gate structure 230 in the semiconductor substrate 204. Referring to FIG. 9, a drain and source extension dopant is implanted toward the semiconductor substrate 204 to form a drain extension 252 and a source extension 254 of the MOSFET around the gate structure 230 in the semiconductor substrate 204.

The drain extension 252 and the source extension 254 are shallow doped junctions to minimize short-channel effects in the MOSFET having submicron or nanometer dimensions, as known to one of ordinary skill in the art of integrated circuit fabrication. To further minimize short-channel effects in the MOSFET, the drain pocket 242 surrounds the drain extension 252 near the channel of the MOSFET, and the source pocket 244 surrounds the source extension 254 near the channel of the MOSFET, as known to one of ordinary skill in the art of integrated circuit fabrication.

The drain extension 252 and the source extension 254 are formed with an N-type dopant when the MOSFET is an NMOSFET (N-channel Metal Oxide Semiconductor Field Effect Transistor). Alternatively, the drain extension 252 and the source extension 254 are formed with a P-type dopant when the MOSFET is a PMOSFET (P-channel Metal Oxide Semiconductor Field Effect Transistor). For minimizing short-channel effects within the MOSFET, the drain pocket 242 and the source pocket 244 are doped with a P-type dopant for an NMOSFET. Alternatively, the drain pocket 242 and the source pocket 244 are doped with an N-type dopant for a PMOSFET.

For efficiently minimizing short-channel effects within the MOSFET, the drain pocket 242 extends beyond the drain extension 252 toward the channel of the MOSFET, and the source pocket 244 extends beyond the source extension 254 toward the channel of the MOSFET. Thus, referring to FIG. 8, the halo dopant for formation of the drain pocket 242 and the source pocket 244 is implanted at an angle toward the gate structure 230 such that the drain pocket 242 and the source pocket 244 extends further toward the channel of the MOSFET. On the other hand, referring to FIG. 9, the drain and source extension dopant is implanted substantially vertically toward the semiconductor substrate 204 such that the drain extension 252 and the source extension 254 do not extend as far toward the channel of the MOSFET. Such implantation angles ensure that the drain pocket 242 surrounds the drain extension 252 and that the source pocket 244 surrounds the source extension 254.

Furthermore, the longer length toward the top of the gate structure 230 blocks the drain and source extension dopant near the channel of the MOSFET to further ensure that the drain pocket 242 surrounds the drain extension 252 and that the source pocket 244 surrounds the source extension 254. Because of such blockage of the drain and source extension dopant by the gate structure 230 near the channel of the MOSFET, the tilt angle for implantation of the halo dopant for formation of the drain pocket 242 and the source pocket 244 may be decreased from the conventional tilt angles that are as large as 45° to 60°. Such large tilt angles used in halo dopant implantation of the prior art results in disadvantageous shadowing effects as known to one of ordinary skill in the art of integrated circuit fabrication, and the gate structure 230 of an aspect of the present invention is advantageous for decreasing the tilt angle of implantation of the halo dopant for formation of the drain pocket 242 and the source pocket 244.

Figure 10:
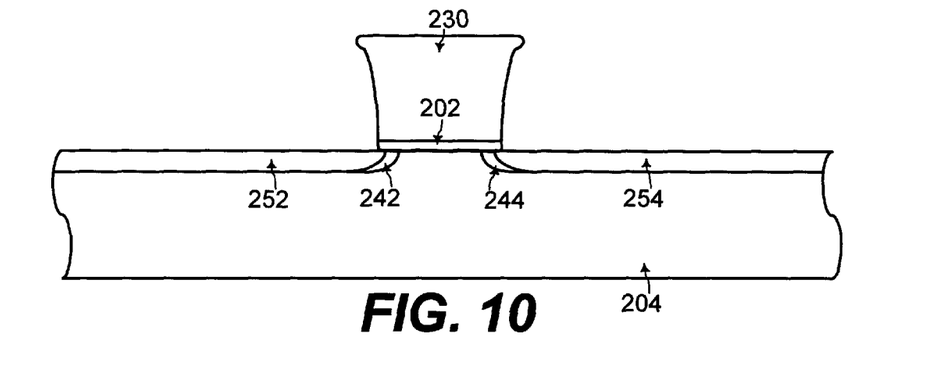

Referring to FIG. 10, the dopant within the drain extension 252 and the source extension 254 is activated using an RTA (Rapid Thermal Anneal) process as is known to one of ordinary skill in the art of integrated circuit fabrication. With such a thermal anneal process, the drain extension 252 and the drain pocket 242 diffuse further toward the channel of the MOSFET such that the gate structure 230 overlaps the drain extension 252. Similarly, during such a thermal process, the source extension 254 and the source pocket 244 diffuse further toward the channel of the MOSFET such that the gate structure 230 overlaps the source extension 254.

Figure 11:
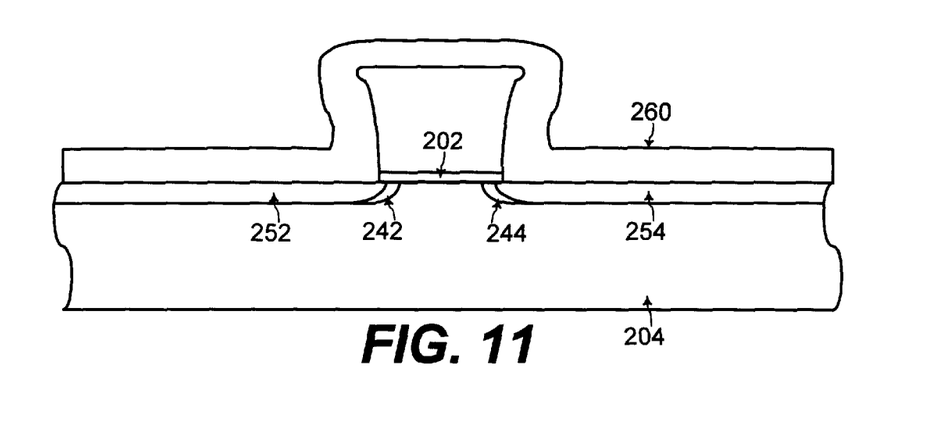

Referring to FIG. 11, for formation of the spacer on the sidewalls of the gate structure 230, a layer of spacer dielectric 260 is conformally deposited on the exposed surfaces of the gate structure 230. The layer of spacer dielectric 260 may be comprised of silicon dioxide ($SiO_2$) for example when the semiconductor substrate 204 is a silicon substrate. Processes for conformally depositing such a layer of spacer dielectric 260 are known to one of ordinary skill in the art of integrated circuit fabrication. The longer length of the gate structure 230 toward the top of the gate structure 230 results in bulging of the spacer dielectric surrounding the top of the gate structure 230 as illustrated in FIG. 11.

Figure 12:
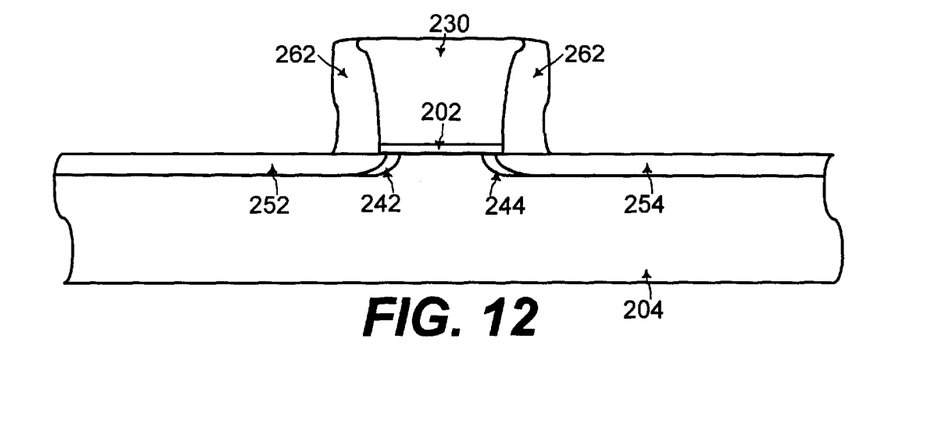

Referring to FIG. 12, the layer of spacer dielectric 260 is anisotropically etched to remove spacer dielectric from the horizontal surfaces such that the spacer dielectric remains on the sidewalls of the gate structure 230 to form spacer 262 of the MOSFET. Processes for anisotropically etching the layer of spacer dielectric 260 are known to one of ordinary skill in the art of integrated circuit fabrication. Referring to FIGS. 11 and 12, because the layer of spacer dielectric 260 is bulging toward the top of the gate structure 230 as illustrated in FIG. 11, the anisotropic etch of the layer of spacer dielectric 260 results in the spacer 262 having a substantially rectangular shape.

Figure 13:
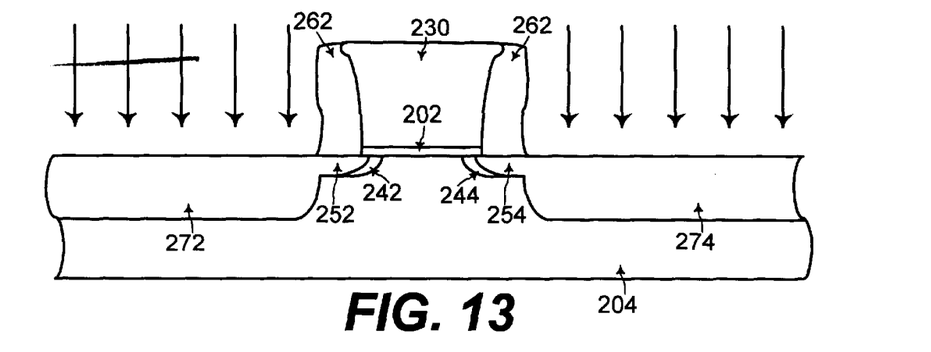

Referring to FIG. 13, with the spacer 262 that is substantially rectangular in shape, a drain and source contact dopant is implanted toward the semiconductor substrate 204 to form a drain contact junction 272 and a source contact junction 274 around the spacer 262. Referring to FIG. 1, because of the gradual diminishing of the thickness of the triangular spacer 116 of the prior art toward the semiconductor substrate 102, the drain and source contact dopant is implanted with a relatively low implantation energy in the prior art. The low implantation energy of the prior art disadvantageously results in further extension of the drain contact junction 118 and the source contact junction 120 under the spacer 116 toward the channel of the MOSFET of the prior art.

Such further extension adds to the capacitance at the drain and source of the MOSFET to degrade the speed performance of the MOSFET. Furthermore, such further extension toward the channel of the MOSFET may undesirably result in higher transient enhanced diffusion of the implanted dopant near the channel of the MOSFET of the prior art.

In addition, such limitation of the implantation energy results in a limit of the depth of the drain contact junction 118 and the source contact junction 120 of the MOSFET of the prior art. However, a large depth of the drain contact junction and the source contact junction is desired for minimizing the resistance and the junction capacitance at the drain and source of the MOSFET.

Referring to FIG. 13, because the spacer 262 of the present invention has substantially a rectangular shape, the drain and source contact dopant may be implanted with a relatively higher implantation energy. In addition, with such a rectangular spacer, the drain and source contact junctions 272 and 274 at the side toward the channel of the MOSFET are more abrupt such that the extension of the drain and source contact junctions 272 and 274 under the spacer 262 toward the channel of the MOSFET is minimized with the present invention.

Such minimization of the extension of the drain contact junction 272 and the source contact junction 274 under the spacer 262 in turn minimizes the capacitance at the drain and source of the MOSFET to enhance the speed performance of the MOSFET of the present invention. Furthermore, such minimization of the extension of the drain contact junction 272 and the source contact junction 274 under the spacer 262 also minimizes the transient enhanced dopant diffusion near the channel of the MOSFET of the present invention.

Moreover, such an increase in the implantation energy in turn results in a larger depth of the drain contact junction 272 and the source contact junction 274 of the MOSFET of the present invention. The large depth of the drain contact junction 272 and the source contact junction 274 minimizes the resistance at the drain and source of the MOSFET by allowing for a large volume of silicide to be formed therein.

Figure 14:
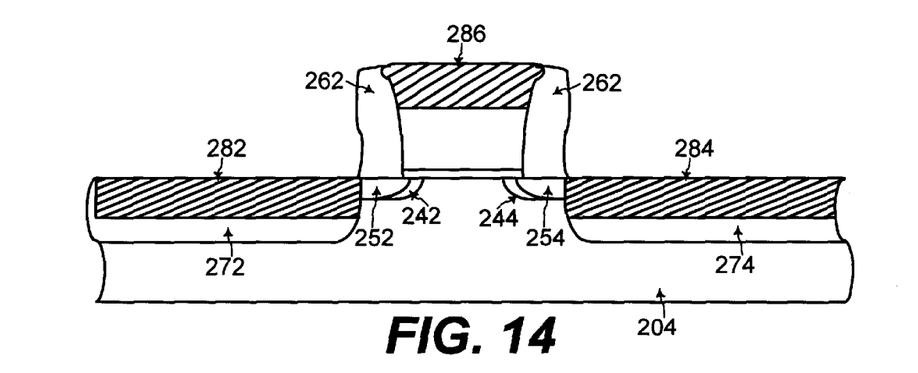

Referring to FIG. 14, a drain silicide 282 is formed with the drain contact junction 272, and a source silicide 284 is formed with the source contact junction 274. Because the depth of drain contact junction 272 and the source contact junction 274 may be increased with the rectangular shaped spacer 262, the volume of the drain silicide 282 and the source silicide 284 may be increased for minimizing the resistance at the drain and source of the MOSFET of the present invention. In addition with the deeper depth of the drain and source contact junctions 272 and 274, a more gradual change in concentration of the implanted dopant results in lower junction capacitance for the drain contact junction 118 and the source contact junction 120 for enhanced speed performance of the MOSFET.

A gate silicide 286 is formed on the gate structure 230. Because of the longer length toward the top of the gate structure 230 of the present invention, the volume of the gate silicide 286 may be increased for a given channel length of the MOSFET for minimizing the resistance at the gate of the MOSFET of the present invention.

Furthermore, comparing FIGS. 2 and 14, because of the rectangular shape of the spacer 262, the gate silicide 286 is separated from the drain silicide 282 and the source silicide 284 by a relatively larger distance of the spacer 262 along the depth of the gate structure 230 such that the undesired "bridging effect" whereby the gate silicide contacts the drain silicide or source silicide is avoided in the MOSFET of the present invention.

Figure 15:
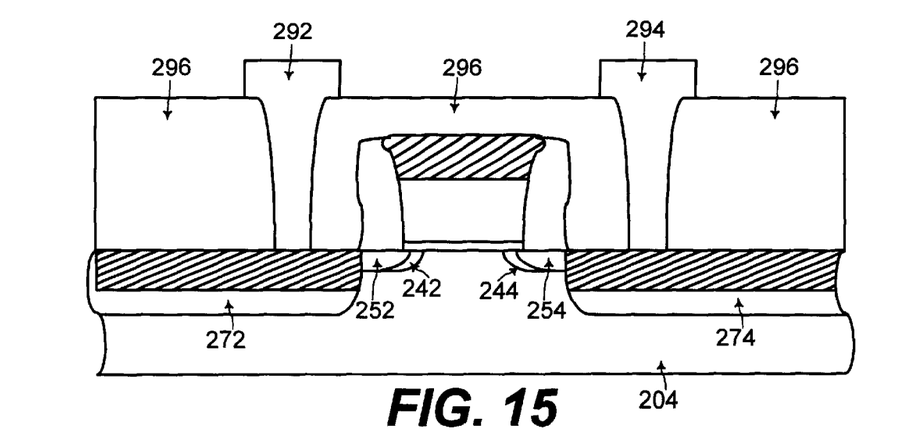

The drain silicide 282, the source silicide 284, and the gate silicide 286 may be comprised of one of cobalt silicide ($CoSi_2$) or titanium silicide ($TiSi_2$) for example, and processes for formation of such silicides are known to one of ordinary skill in the art of integrated circuit fabrication. Referring to FIG. 15, conventional fabrication processes may follow for forming contacts and interconnects to the MOSFET such as a drain contact 292 to provide connection to the drain silicide 282 and a source contact 294 to provide connection to the source silicide 284. Field oxides 296 may also be deposited for electrical isolation of the components of the MOSFET.

Figure 16:
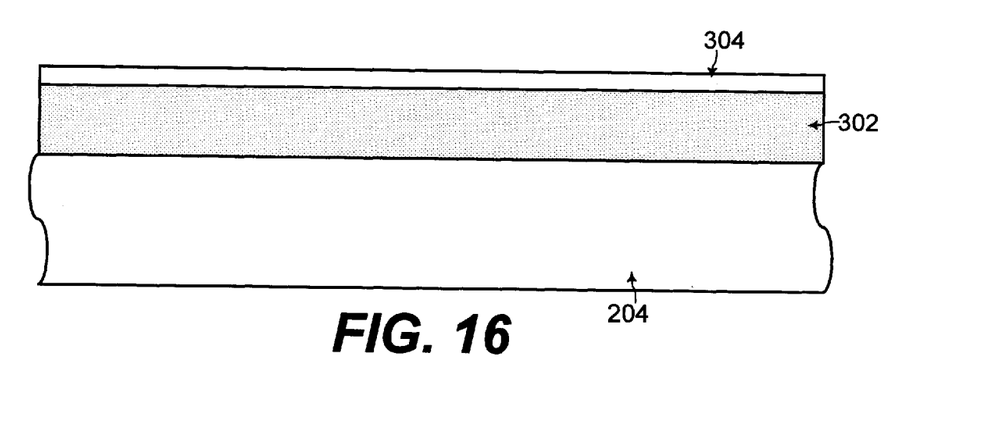
Figure 17:
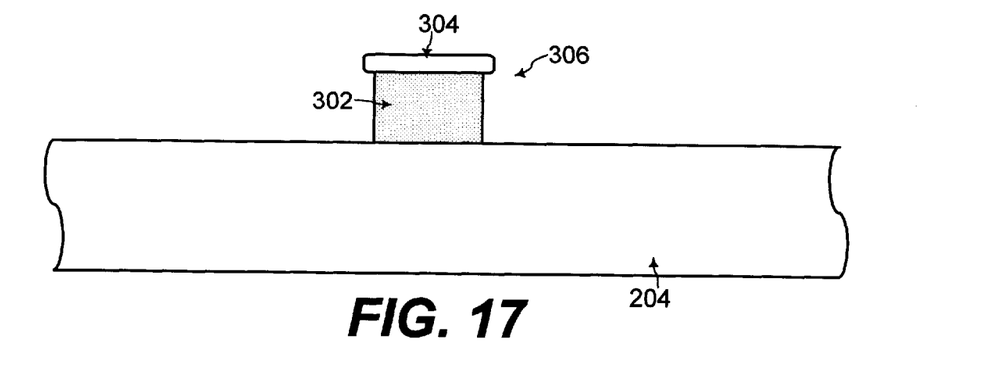

The foregoing is by way of example only and is not intended to be limiting. For example, a longer length toward the top of the gate structure of the present invention may be formed by controlling the composition of the gate structure material by depositing multiple layers of gate structure material having different etch rates. Referring to FIG. 16, for example, the layer of gate structure material for forming the gate structure of the present invention includes a bottom layer of amorphous silicon 302 deposited closer to the semiconductor substrate 204. The layer of gate structure material for forming the gate structure of the present invention further includes a top layer of polysilicon 304 deposited further from the semiconductor substrate 204. Referring to FIG. 17, the top layer of polysilicon 304 etches with a slower etch rate than that of the bottom layer of amorphous silicon 302 such that patterning and etching of the top layer of polysilicon 304 and the bottom layer of amorphous silicon 302 results in a T-shaped gate structure 306 that is similar to the gate structure 230 of FIG. 6.

Furthermore, as will be understood by those skilled in the art, the structures described herein may be made or used in the same way regardless of their position and orientation. Accordingly, it is to be understood that terms and phrases such as "top," "bottom," "sidewalls," and "depth" as used herein refer to relative location and orientation of various portions of the structures with respect to one another, and are not intended to suggest that any particular absolute orientation with respect to external objects is necessary or required. In addition, any materials mentioned herein are by way of example only.

The present invention is limited only as defined in the following claims and equivalents thereof.

We claim:

1. A method for fabricating a gate structure of a field effect transistor on a semiconductor substrate, the method including the steps of:
    A. depositing a layer of gate structure material on said semiconductor substrate;
    B. adjusting a composition of said layer of gate structure material along a depth of said layer of gate structure material for a slower etch rate toward a top of said layer of gate structure material that is further from said semiconductor substrate;
    C. forming said gate structure by patterning and etching said layer of gate structure material, wherein said slower etch rate toward said top of said layer of gate structure material results in a longer length toward a top of said gate structure that is further from said semiconductor substrate;
    D. depositing spacer dielectric on exposed surfaces of said gate structure; and
    E. anisotropically etching said spacer dielectric such that said spacer dielectric remains on sidewalls of said gate structure,
        wherein said longer length toward said top of said gate structure results in a substantially rectangular shaped spacer dielectric remaining on said sidewalls of said gate structure.

2. The method of claim 1, wherein said gate structure material is comprised of polysilicon and wherein said gate dielectric is comprised of silicon dioxide ($SiO_2$).

3. A method for fabricating a gate structure of a field effect transistor on a semiconductor substrate, the method including the steps of:
    A. depositing a layer of gate structure material on said semiconductor substrate;
    B. adjusting a composition of said layer of gate structure material along a depth of said layer of gate structure material for a slower etch rate toward a top of said layer of gate structure material that is further from said semiconductor substrate;
    C. forming said gate structure by patterning and etching said layer of gate structure material, wherein said slower etch rate toward said top of said layer of gate structure material results in a longer length toward a top of said gate structure that is further from said semiconductor substrate;
    D. implanting halo dopant toward said semiconductor substrate having said gate structure to form a drain pocket and a source pocket of said field effect transistor in said semiconductor substrate around said gate structure; and
    E. implanting source and drain extension dopant toward said semiconductor substrate to form a drain extension and a source extension of said field effect transistor in said semiconductor substrate around said gate structure,
        wherein said halo dopant is implanted at an angle toward said gate structure and wherein said source and drain extension dopant is implanted vertically toward said semiconductor substrate such that said drain pocket surrounds said drain extension and such that said source pocket surrounds said source extension toward a channel of said field effect transistor.

4. The method of claim 3, further including the steps of:
    depositing spacer dielectric on exposed surfaces of said gate structure; and
    anisotropically etching said spacer dielectric such that said spacer dielectric remains on sidewalls of said gate structure,
    wherein said longer length toward said top of said gate structure results in a substantially rectangular shaped spacer dielectric remaining on said sidewalls of said gate structure.

5. The method of claim 4, further including the step of:
    implanting source and drain contact dopant toward said semiconductor substrate to form a drain contact junction and a source contact junction of said field effect transistor in said semiconductor substrate around said spacer dielectric,
    wherein said source and drain contact dopant is implanted vertically toward said semiconductor substrate.

6. The method of claim 5, further including the step of:
forming silicide within said gate structure and said drain contact junction and said source contact junction of said field effect transistor.

7. A method of fabricating a MOSFET (Metal Oxide Semiconductor Field Effect Transistor) within a silicon substrate, the method including the steps of:
A. depositing a layer of polysilicon on said silicon substrate;
B. implanting nitrogen dopant into said layer of polysilicon, wherein a concentration of said nitrogen dopant varies along a depth of said layer of polysilicon, and wherein a lower concentration of said nitrogen dopant toward a top of said layer of polysilicon that is further from said silicon substrate results in a slower etch rate toward said top of said layer of polysilicon;
C. patterning and etching said layer of polysilicon to form a gate structure of said MOSFET, wherein said slower etch rate toward said top of said layer of polysilicon results in a longer length toward a top of said gate structure that is further from said silicon substrate, and wherein said gate structure with said longer length toward said top of said gate structure has a T-shape;
D. implanting halo dopant toward said silicon substrate having said gate structure to form a drain pocket and a source pocket of said MOSFET in said silicon substrate around said gate structure;
E. implanting source and drain extension dopant toward said silicon substrate to form a drain extension and a source extension of said MOSFET in said silicon substrate around said gate structure,
wherein said halo dopant is implanted at an angle toward said gate structure and wherein said source and drain extension dopant is implanted vertically toward said silicon substrate such that said drain pocket surrounds said drain extension and such that said source pocket surrounds said source extension toward a channel of said MOSFET;
F. depositing spacer dielectric of silicon dioxide (SiO$_2$) on exposed surfaces of said gate structure;
G. anisotropically etching said spacer dielectric such that said spacer dielectric remains on sidewalls of said gate structure,
wherein said longer length toward said top of said gate structure results in a substantially rectangular shaped spacer dielectric remaining on said sidewalls of said gate structure;
H. implanting source and drain contact dopant toward said silicon substrate to form a drain contact junction and a source contact junction of said MOSFET in said silicon substrate around said spacer dielectric,
wherein said source and drain contact dopant is implanted vertically toward said silicon substrate; and
forming silicide within said gate structure and said drain contact junction and said source contact junction of said MOSFET.

8. The method of claim 1, wherein said step B includes the step of:
implanting a dopant into said layer of gate structure material, wherein a concentration of said dopant varies along said depth of said layer of gate structure material, and wherein a lower concentration of said dopant toward said top of said layer of gate structure material results in said slower etch rate toward said top of said layer of gate structure material.

9. The method of claim 8, wherein said layer of gate structure material is comprised of polysilicon, and wherein said dopant is comprised of nitrogen (N).

10. The method of claim 8, wherein said layer of gate structure material is comprised of polysilicon, and wherein said dopant is comprised of silicon (Si).

11. The method of claim 1, wherein said step B includes the steps of:
depositing a bottom layer of amorphous silicon closer to said semiconductor substrate as part of said layer of gate structure material; and
depositing a top layer of polysilicon further from said semiconductor substrate as part of said layer of gate structure material,
wherein said top layer of polysilicon etches with said slower etch rate than said bottom layer of amorphous silicon.

12. The method of claim 1, wherein said gate structure with said longer length toward said top of said gate structure has a T-shape.

13. The method of claim 1, wherein said gate structure with said longer length toward said top of said gate structure has an I-shape.

* * * * *